(12) United States Patent
Limb et al.

(10) Patent No.: US 8,765,226 B2
(45) Date of Patent: Jul. 1, 2014

(54) METHOD FOR PATTERNING USING PHASE-CHANGE MATERIAL

(75) Inventors: Scott Limb, Palo Alto, CA (US); Uma Srinivasan, Mountain View, CA (US)

(73) Assignee: Palo Alto Research Center Incorporated, Palo Alto, CA (US)

(*) Notice: Subject to any disclaimer, the term of this patent is extended or adjusted under 35 U.S.C. 154(b) by 123 days.

(21) Appl. No.: 13/419,351

(22) Filed: Mar. 13, 2012

(65) Prior Publication Data

US 2012/0169820 A1 Jul. 5, 2012

Related U.S. Application Data

(63) Continuation-in-part of application No. 11/956,205, filed on Dec. 13, 2007, now abandoned.

(51) Int. Cl.
*B05D 1/32* (2006.01)
*C23C 4/02* (2006.01)

(52) U.S. Cl.
USPC ............ 427/282; 427/455; 427/446; 427/540; 427/580

(58) Field of Classification Search
USPC ......... 427/446, 448, 455, 540, 580, 468, 259, 427/272, 282
See application file for complete search history.

(56) References Cited

U.S. PATENT DOCUMENTS

| | | | | |
|---|---|---|---|---|
| 4,412,377 A | * | 11/1983 | Nagashima et al. | 29/832 |
| 6,742,884 B2 | | 6/2004 | Wong et al. | |
| 6,759,629 B2 | * | 7/2004 | Brieko | 219/136 |
| 6,872,320 B2 | | 3/2005 | Wong et al. | |
| 6,890,050 B2 | | 5/2005 | Ready et al. | |
| 6,972,261 B2 | * | 12/2005 | Wong et al. | 438/706 |
| 2004/0131779 A1 | | 7/2004 | Haubrich et al. | |
| 2005/0136358 A1 | | 6/2005 | Paul et al. | |
| 2007/0172774 A1 | * | 7/2007 | Limb et al. | 430/322 |

OTHER PUBLICATIONS http://www.twi.co.uk/j32k/protected/band_3/ksrdh002.html.
http://www.gordonengland.co.uk/aws.htm.

* cited by examiner

*Primary Examiner* — Dah-Wei D Yuan
*Assistant Examiner* — Nga Leung V Law
(74) *Attorney, Agent, or Firm* — Hollingsworth Davis, LLC (57) ABSTRACT

A patterned layer over a wafer is produced by depositing a print-patterned mask structure. Energized particles of a target material are deposited over the wafer and the print-patterned mask such that particles of said target material incident on the mask structure enter the mask structure body and minimally accumulate, if at all, on the surface of the mask structure, and otherwise the particles of target material accumulate as a generally uniform layer over the wafer. The print-patterned mask structure, including particles of target material therein, is removed leaving the generally uniform layer of target material as a patterned layer over the wafer.

16 Claims, 5 Drawing Sheets

METHOD FOR PATTERNING USING PHASE-CHANGE MATERIAL

CROSS-REFERENCE TO RELATED APPLICATIONS

The present application is a continuation-in-part of copending U.S. Application for Letters Patent titled "Method for Patterning using Phase-Change Material", Ser. No. 11/956,205, filed on Dec. 13, 2007, which is incorporated herein by reference and to which priority is claimed.

BACKGROUND

The present disclosure is related to methods of forming a fine-featured printed layer such as in semiconductor device manufacturing, and more specifically to methods and apparatus employing a print-patterned phase-change material for region masking during material deposition.

There are today many well-known processes for selective material deposition in wafer processing, such as in the manufacture of patterned layers in semiconductor wafer processing. One such process of interest herein is referred to as a liftoff process. In a typical liftoff process, a resist structure is formed over a region of a wafer in order to block the deposition of material in that region. The material of interest is then deposited over at least portions of the wafer, including over the resist structure. The resist structure is then dissolved for example by a solvent, removing both the resist structure and the material of interested deposited thereover. In this way, a definition of a pattern on the wafer surface may be obtained without etching. Since the liftoff process is an alternative to the more common photolithographic etching processes, the liftoff process is often used to define geometry of materials which are difficult to etch, such as gold.

Figure 7A:
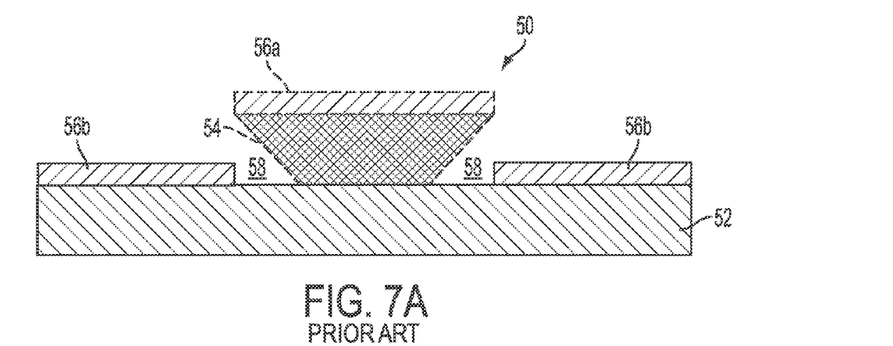
FIGS. 7A and 7B are illustrations of a wafer being patterned, and a patterned wafer, respectively, according to a liftoff process well known in the art.
Figure 7B:
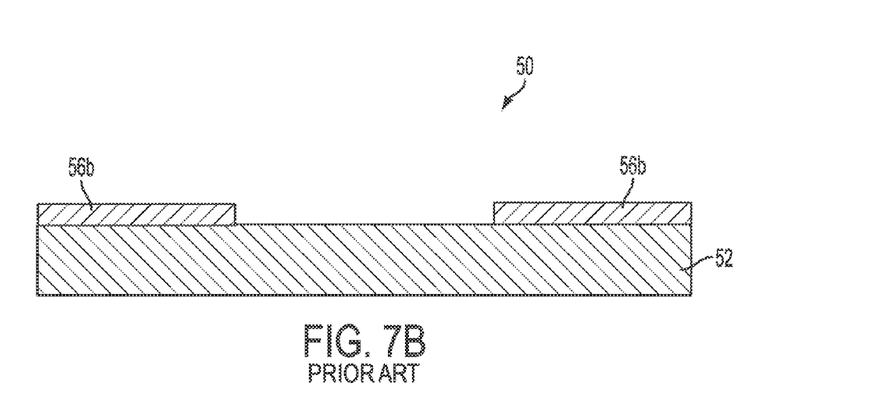

One requirement for a liftoff process is that in the process of forming the resist structure, means for introducing the solvent underneath the deposited material of interest must be provided so that the solvent may dissolve the underlying resist structure. This typically requires that the resist structure be taller (i.e., thicker) than the thickness of the deposited layer of material of interest. Furthermore, the resist structure is typically patterned during or after deposition so that the solvent may contact as much of the resist structure as possible and so that it dissolves the resist structure as quickly as possible, for example by providing the resist structure with re-entrant sidewalls. An example of a structure used in this process is illustrated in FIGS. 7A and 7B. With reference to FIG. 7A, substrate 50 has formed thereon a resist structure 54, patterned to have reentrant sidewalls, and a target material layer 56 formed thereover such that a first portion 56a overlies resist structure 54 and a second portion 56b directly overlies the substrate 52 (or alternatively, intermediate layers, not shown). A solvent may be introduced into regions 58 due to the reentrant sidewall profile of resist structure 54 to thereby dissolve and remove resist structure 54 and with it remove portion 56a of layer 56. The device following the liftoff step is shown in FIG. 7B.

While liftoff is an effective process for wafer patterning, the process has several limitations. First, the resist structure must be formed to be significantly taller than the target material layer, or conversely the thickness of the target layer must be made thin relative to that of the resist structure. Second, the resist structure must be patterned during or after deposition so as to have a reentrant sidewall profile. Each of these limitations result in a relatively high cost and complexity of this wafer patterning process. Furthermore, there is a limit to the width of a useful resist structure and hence to the width of the masked region. If the mask structure is too wide, the solvent takes a significant time to fully undercut the structure, resulting in unwanted damage to other portions of the structure by the solvent. Thus, there is a need in the art for a process which provides a patterned wafer without requiring etching and without limitations on thickness of a target material layer or width of the masked region.

SUMMARY

Accordingly, the present disclosure is directed to systems and methods for producing a patterned wafer which do not require that the masking structure be significantly taller than the target layer of material which is to be patterned. Additionally, the resist sidewall profile does not need to be re-entrant. Furthermore, the present disclosure does not require the patterning of the mask structure following deposition. In addition, the present disclosure does not limit the width of the region to be masked.

In addition, the removal of the mask structure is dependent only on the thickness of the structure, and not its areal dimensions. The top of the mask structure is exposed, as opposed to being covered by a layer of target material. Therefore, undercutting is not required, and the mask can be attacked from top. Thus, the thickness of the mask will determine rate of removed. Removal of the mask structure according to the present disclosure is therefore less complex and less expensive as compared to prior art mask structures. Therefore, the present disclosure overcomes a number of the limitations of the previously-described liftoff process.

According to one aspect of the present disclosure, a print-patterned mask structure is formed over a substrate. The mask structure may be formed directly on the substrate or on an intermediate layer formed over the substrate. The mask structure may be formed by depositing individual droplets of a phase-change material, such as a wax, using an ink-jet type print head. A target material is then deposited over the mask structure and layer the mask structure is formed on (e.g., the substrate). According to one embodiment, the target material is deposited with sufficient energy, for example kinetic energy, that particles of the material incident on mask structure actually enter the body of the mask structure as opposed to building up as a layer over the surface of the mask structure. Other than over the mask structure, the target material builds up as a uniform layer. The layer of target material is therefore discontinuous in the region of the mask structure. The mask structure with embedded target material may then be removed by a solvent, etchant, and/or heating, leaving the region previously occupied by the mask structure open and free of target material.

According to another aspect of the present disclosure, the target material may be heated such that its thermal energy permits particles of the material in the region of the mask structure to enter the body of the mask structure. Alternatively, or in addition, the mask structure may be heated to facilitate the introduction of the target material during deposition.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

In the following detailed description, digital lithography is employed to form a print-patterned mask. Digital lithography is a process for directly depositing material in desired patterns onto a substrate, taking the place of the delicate and time-consuming photolithography processes used in conventional wafer fabrication. Digital lithography typically uses a printer head to controllably eject individual droplets from a reservoir to form a patterned layer over regions of a substrate. The droplets are commonly of a phase change material. One application of digital lithography is the deposition of material in a printed pattern designed to act as a mask (thus referred to herein as a "print-patterned mask"). Of course, it is to be understood that other printing systems may be used to form the mask, as it will become apparent from the following description that the material forming the mask forms a more critical aspect of the present disclosure than the method of its deposition.

A system suitable for implementing the embodiments of the method set forth below is described in U.S. Pat. No. 6,972,261, Wong, et al., the disclosure of which is incorporated herein by reference. More specifically, with reference to FIG. 1, there is shown therein the relevant components of a system 10, which includes a heat source 12 that heats a reservoir 14 typically containing a phase-change material. The phase-change material is thereby heated to a temperature that is sufficient to maintain the material in a liquid state. The temperature of the reservoir is generally maintained above 50 degree centigrade and, in some situations, at temperatures above 100 degrees centigrade, a temperature sufficient to liquefy many organic materials that are in the solid phase near room temperature.

The phase-change material may be an organic material that melts at temperatures higher than room temperature. Other desirable characteristics of the phase-change material include that the patterning material is non-reactive with organic and inorganic materials which are or will be deposited on the wafer and used in such deposition, and that the phase change material has a high selectivity to etchants and particularly solvents. In one embodiment, the phase-change material dissolves in a basic solution (i.e., is "base-strippable"), although in other embodiments other characteristics of the solvent and/or apparatus may be employed to remove (if desired) the phase-change material.

Wax is an example of a phase-change material with the previously described characteristics. Kemamide 180-based waxes from Crompton Corporation of Middlebury, Conn., are but one example of a suitable wax for use as a phase-change patterning material.

Returning to FIG. 1, in this system, one or more droplet sources such as droplet source 16 receives the liquid phase-change material from reservoir 14 and outputs droplets 18 for deposition on a substrate 20. The substrate 20 may be maintained at a temperature such that the droplet cools rapidly after deposition.

Figure 1:
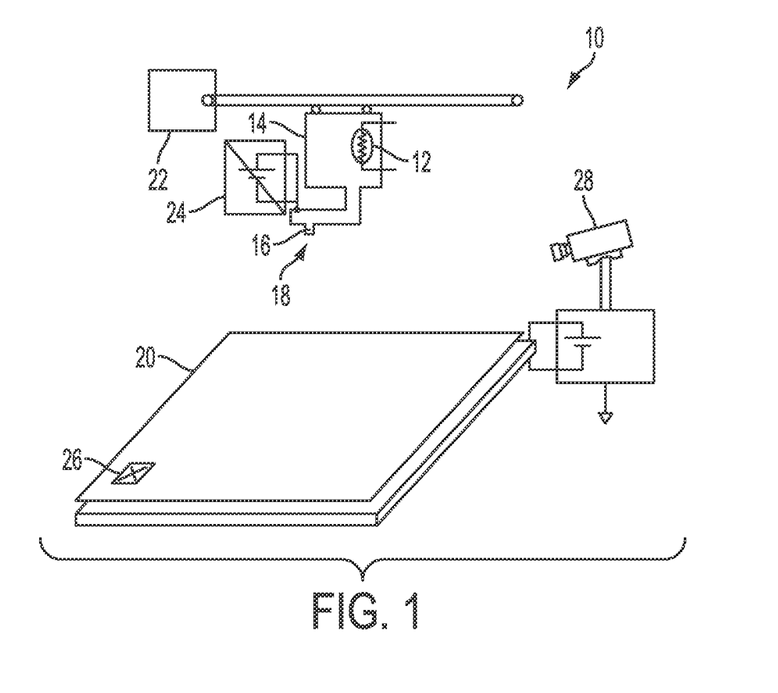
FIG. 1 is an illustration of a system for the deposition of a print-patterned mask material as might be employed in one step of the present disclosure.

When increased coalescence between adjacent droplets is required, such as in the formation of masked areas having dimensions great that the dimensions of a single droplet (roughly 30-40 micrometers in diameter), the substrate temperature can be increased to increase droplet spreading and thereby increase coalescence. When printing lines of Kemamide-based wax from an acoustic ink-jet printer, it has been found that increasing the substrate temperature from 30 degrees to 40 degrees centigrade improves the print quality of the pattern. In the case of Kemamide-based waxes, it has been found that excellent results are achieved when the surface is maintained at 40 degrees centigrade, which is about 20 degrees centigrade below the solid phase point of the wax. At 40 degrees centigrade, the temperature of the substrate is still low enough that the droplet rapidly solidifies upon contacting substrate 20.

After a droplet of phase-change material is deposited on substrate 20, the relative positions of substrate 20 and droplet source 16 are adjusted to reposition droplet source 16 over a second position to be patterned. The repositioning operation may be achieved either by moving droplet source 16 or by moving substrate 20. As shown in FIG. 1, a control circuit 22 moves droplet source 16 in a predetermined pattern over substrate 20. A driver circuit 24 provides energy to droplet source 16, causing ejection of droplets when the droplet source 16 is positioned over a region of substrate 20 to be patterned. By coordinating the movement of droplet source 16 with the timing of droplet source outputs, a pattern can be "printed" on substrate 20.

The presently described method ultimately is used to produce patterned wafers and other structures. As such, it is desired to form printed mask features in specific positions on the surface of substrate 20. Positional registration of the deposition of droplets 18 forming a print-patterned mask is routinely accomplished in digital lithographic systems by use of fiduciary marks, digital imaging and processing, and processor controlled relative motion of the droplet source and the substrate. The ability to align the formation of a mask over substrate 20 through image processing prior to and while patterning is a significant advantage of the digital-lithographic process over other masking methods.

In order to control and align the movement of droplet source 16, printed fiduciary alignment marks, such as mark 26, may be applied or formed on a surface of the layer upon which the phase-change material is to be applied. Alternatively, the fiduciary marks may be on a carrier holding substrate 20 during the deposition process (not shown). An image processing system such as a camera 28 may be used to coordinate the orientations of the droplets and the surface on which they are applied. A processing system then adjusts for the position of the pattern layer by altering the pattern image file before actual printing of the pattern layer. Positioning adjustment are accomplished in software and translated to movements of the droplet source 16.

Each droplet source may be implemented using a variety of technologies including traditional ink-jet technology. An alternative technology well suited for generating extremely small droplet sizes is the use of sound waves to cause ejection of droplets of patterning material as done in acoustic ink printing systems, as described in, for example, U.S. Pat. No. 6,972,261, Wong et al. Examples of such systems appropriate for the ejection of droplets of phase-change material include: ink-jet systems (such as disclosed in U.S. Pat. No. 4,131,899, which is incorporated herein by reference), ballistic aerosol marking (BAM) devices (such as disclosed in U.S. Pat. No. 6,116,718, which is incorporated herein by reference), acoustic ink printer (AIP) systems (U.S. Pat. No. 4,959,674, which is incorporated herein by reference), carrier-jet ejectors (as disclosed in U.S. Pat. No. 5,958,122, which is incorporated by reference herein), deflection-controlled ink-jet systems (such as disclosed in U.S. Pat. No. 3,958,252, which is incorporated herein by reference), etc. Such systems also include pattern transfer systems, such as: xerographic, ionographic, screen, contact, and gravure printing systems, etc.

Described next are specific steps for the formation of a print-patterned mask, and the production of a patterned wafer formed with said mask. FIGS. 2 through 5 illustrate a first embodiment of a device at several intermediate stages of its production according to a process illustrated in FIG. 6. While the following description makes specific reference to the device illustrated in FIGS. 2 through 5, without making more specific reference thereto the description is following the sequence illustrated in FIG. 6.

Figure 2:
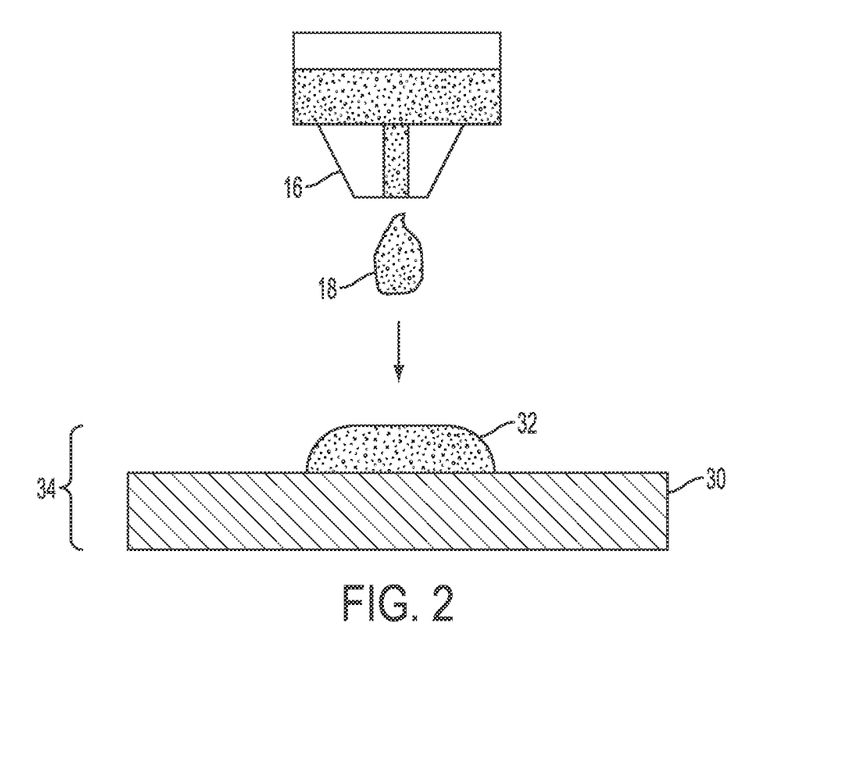
FIG. 2 is an illustration of a wafer in the process of having a mask structure formed thereon according to one embodiment of the present disclosure.

With reference to FIG. 2, the process of forming a mask on a substrate for the production of a patterned wafer is illustrated. Droplet 18 ejected from droplet source 16 impacts the surface of substrate 30 to form a mask feature 32. While the present description assumes that droplet 18 is deposited directly onto the surface of substrate 30, it will be understood that it is within the scope of the present description that droplet 18 may also be deposited onto an intermediate layer (not shown) formed on or over the surface of substrate 30. While the dimensions of mask feature 32 may vary depending on the volume of material ejected from droplet source 16, the material comprising droplet 18, the nature of the surface of substrate 30 (affecting the wetting of the droplet), the temperature of substrate 30, etc., typically mask feature 32 will have a diameter of 30-50 microns. A wider mask feature may be obtained by coalescing adjacent droplets, as previously described. Mask feature 32, together with a plurality of similar such features (not shown), forms a print-patterned mask. Substrate 30 together with the print-patterned mask (and any intermediate layer or layers) form structure 34.

Figure 3:
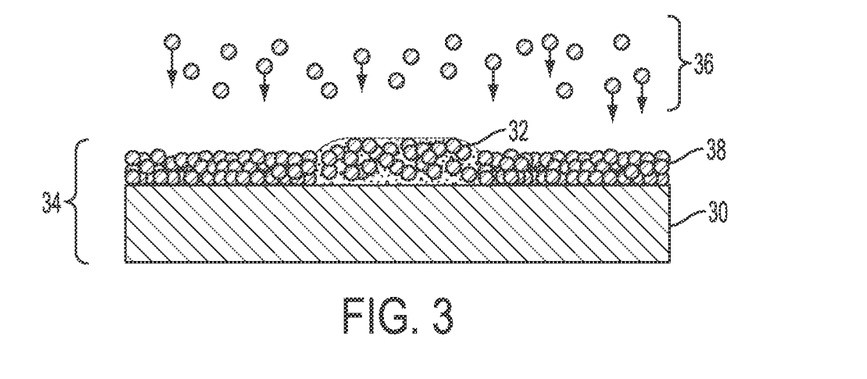
FIG. 3 is an illustration of a wafer having a mask structure formed thereon and in the process of having a target material applied thereto according to one embodiment of the present disclosure.

A target material is next deposited over structure 34. The print-patterned mask formed of feature 32, together with a plurality of similar such features, represents the regions over substrate 30 which will be free of such deposited material. Deposition of the target material is illustrated in FIG. 3. The target material can be one of a wide variety of materials, elemental or alloyed. One specific example of particles of target material 36 is aluminum (Al). While the actual target material may vary, the method and nature of its deposition forms an important aspect of the present disclosure.

Figure 4:
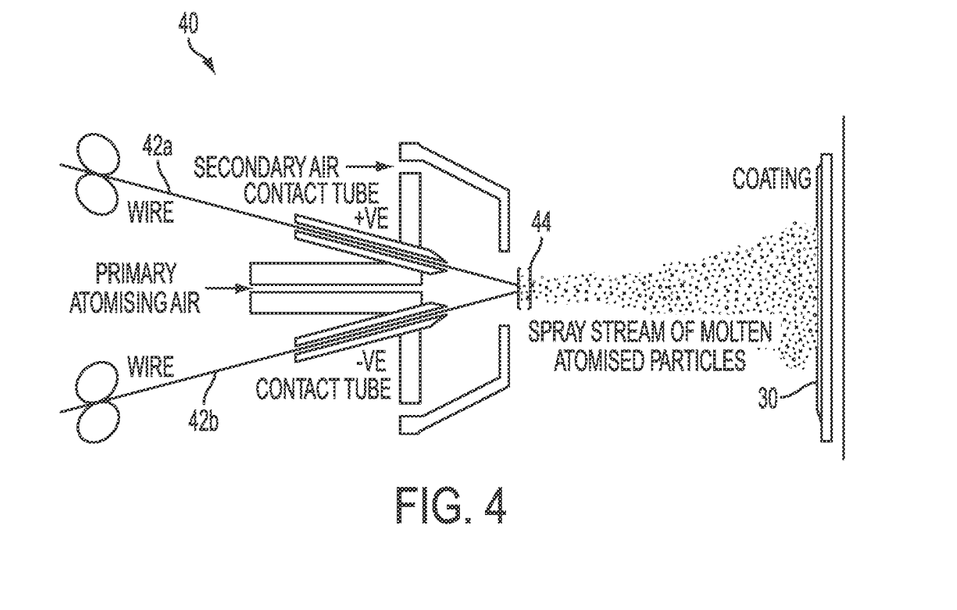
FIG. 4 is an illustration of an arc spraying apparatus which might be employed in one step of the present disclosure.

According to a first embodiment of the present disclosure, the target material is deposited by an arc spraying process. An apparatus 40 for arc spraying is illustrated in FIG. 4. In the arc spraying process a pair of electrically conductive wires 42a, 42b are melted by means of an electric arc at 44. The molten material is atomized by compressed air and propelled towards the surface of substrate 30. The energetic molten particles impact the substrate and solidify thereon to form a coating.

Returning to FIG. 3, atomized particles 36 of the target layer material are directed toward structure 34. Two different results are simultaneously obtained. First, in regions where the surface of substrate 30 is exposed (i.e., other than where mask feature 32 is located) the atomized particles accumulate to form layer 38 of the target material. Second, particles 36 are caused to be sufficiently energetic by the arc spraying process that in the region of mask feature 32, the particles actually enter the body of material forming mask feature 32. If the majority of such particles are sufficiently energetic, very few if any of the particles accumulate on the surface of mask feature 32, but rather become embedded therein. In this way, layer 38 is actually discontinuous in the region of mask feature 32.

It will be understood that while it is possible that a small portion of the target material particles do settle on the surface of mask feature 32, the number of such particles will be relatively very small, and the thickness of the layer of such particles over mask feature 32 will be relatively very thin. Such a thin layer is easily separated from the relatively much thicker layer 38 of target material (often of its own accord, for example by cooling-induced contraction), effectively rendering layer 38 discontinuous.

The energy required for target material particles 36 to enter the body of mask feature 32 may take one or more forms. Particles 36 may, for example, have sufficient kinetic energy to enter feature 32. For example, the propellant for the arc spraying process transfers kinetic energy in the form of the momentum of the particles in the direction of feature 32. Given a sufficient momentum (and permeability of the material forming feature 32), particles 36 may embed themselves in feature 32.

Particles 36 may also have sufficient thermal energy to enter feature 32. For example, in the process of atomizing the conductive wire material, the electric arc heats said material. While the particles may lose some of this thermal energy to the environment, they may retain sufficient thermal energy to cause a local softening or even melting of the material forming feature 32 such that they become embedded therein.

Of course, particles 36 may have a combination of kinetic and thermal energy sufficient to result in their entry into feature 32. For example, the arc spraying process typically provides both momentum and heat to the particles as they atomize from the conductive wires. Thus, in this embodiment it is the combination of kinetic and thermal energy which results in the introduction of particles 36 into the body of feature 32.

The energy required for particles 36 to enter feature 32 is in part a function of the hardness of feature 32, which is in turn a function of the temperature of feature 32. For thermal spraying deposition, since the material to be deposited is melted, conditions that provide for sufficient adhesion to the substrate will be adequate to provide enough thermal energy to the wax mask. The thermally sprayed material needs to be molten when it deposits unto a surface. Depending on the material, that molten state temperature will vary. In the case that particles 36 comprise copper, temperatures of particles 36 should be at least 1085 C to be in their molten state. At this temperature, particles 36 of copper will readily enter feature 32.

While the foregoing has focused on imparting energy to particles 36, it is also possible to lower the energy required of those particles by affecting attributes of feature 32. For example, in one embodiment of the present disclosure feature 32 is heated such that it softens and reduces the energy required of particles 32 to become embedded therein. Such heat may be provided by heating substrate 30, by raising the ambient temperature, etc. The wax mask can be heated to below its melting temperature but sufficient to soften the feature, such as in the range of 60 C.-70 C. If a higher melting-point wax is used then the temperature at which the feature material will become sufficiently soft may be higher.

For PVD deposition, a heated substrate will typically be needed. However, in certain embodiments it is possible to heat the ambient such that the feature reaches the 60 C.-70 C. range (or other appropriate range depending on the material used). Still further, it is possible to selectively heat feature 32 as compared to substrate 30. For example, infrared (IR) receptive particles may for a part of feature 32. An IR source may then be made incident over feature 32 and substrate 30, thereby preferentially heating feature 32. Other preferential heating techniques, such as scanning feature 32 with a pinpoint source such as a laser may be used.

Furthermore, the material from which mask feature 32 is formed may be selected such that it is relatively soft, or permeable, in order to minimize the energy required of particles 36. Many different formulations of masking materials, such as wax, are known, as are the physical properties of those materials. Therefore, with knowledge of those properties, and the conditions under which particles 36 are deposited, conditions may be established such that particles 36 enter feature 32 are previously described.

One effect of the foregoing process and conditions of operation is that in certain embodiments the top surface of feature 32 (i.e., the top of the mask) is exposed as opposed to being covered with a layer of target material. Therefore, undercutting of the mask to remove same after deposition of the target material is not required—the mask (and embedded target material) may be removed by a much simpler, less expensive, and less invasive top-down etching.

The aforementioned arc spray process may be operated as a "cold" process, meaning that the atomized particles have lost the majority of the thermal energy from being atomized by the time they reach the substrate. In such a case, heating of feature 32 and/or selecting a relatively soft material for feature 32, will assist with the introduction of particles 32 therein.

While the foregoing has focused on the arc spraying process, it will be appreciated that many other deposition techniques are compatible with the present disclosure. Physical vapor deposition (PVD), laser- and arc-assisted PVD, sputtering, and molecular beam epitaxy (MBE) are examples of physical processes that may provide sufficient kinetic or thermal energy, or both, to result in target material atoms entering the body of mask feature 32 as opposed to forming a layer thereover. Chemical vapor deposition (CVD) and plasma enhanced CVD (PECVD) are example of chemical processes that may provide sufficient chemical energy to result in target material atoms entering the body of mask feature 32 as opposed to forming a layer thereover.

Figure 5:
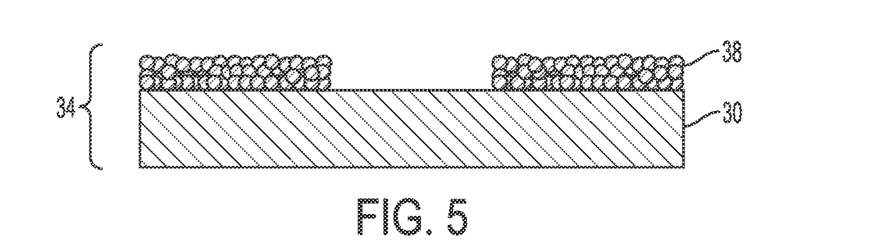
FIG. 5 is an illustration of a wafer having a layer of target material formed thereover and having a mask structure with incorporated target material embedded therein removed from the wafer according to a step of the present disclosure.

With reference next to FIG. 5, the method of the present disclosure proceeds with the step of removing mask feature 32 and the target material embedded therein. The process and material used for this removal step depend in large part upon the material selected for the mask feature 32. In some embodiments, the process and material used also depend on the target material incorporated into mask feature 32 during the deposition of same. According to one embodiment, feature 32 is comprised of the aforementioned Kemamide wax. A solvent such as tetrahydrofuran or other solvent known to the art is applied to the structure, or alternatively, the structure is dipped in a bath of such solvent, which may also be heated, to remove the mask structure. Importantly, with the removal of the mask structure comes removal of the target material embedded therein. The solvent and removal conditions should be such that the deposited target material remaining after removal of the mask structure is not damaged thereby. As the target material layer 38 is discontinuous at the region of mask feature 32, removal of the mask feature 32 does not damage layer 38 in the process.

Figure 6:
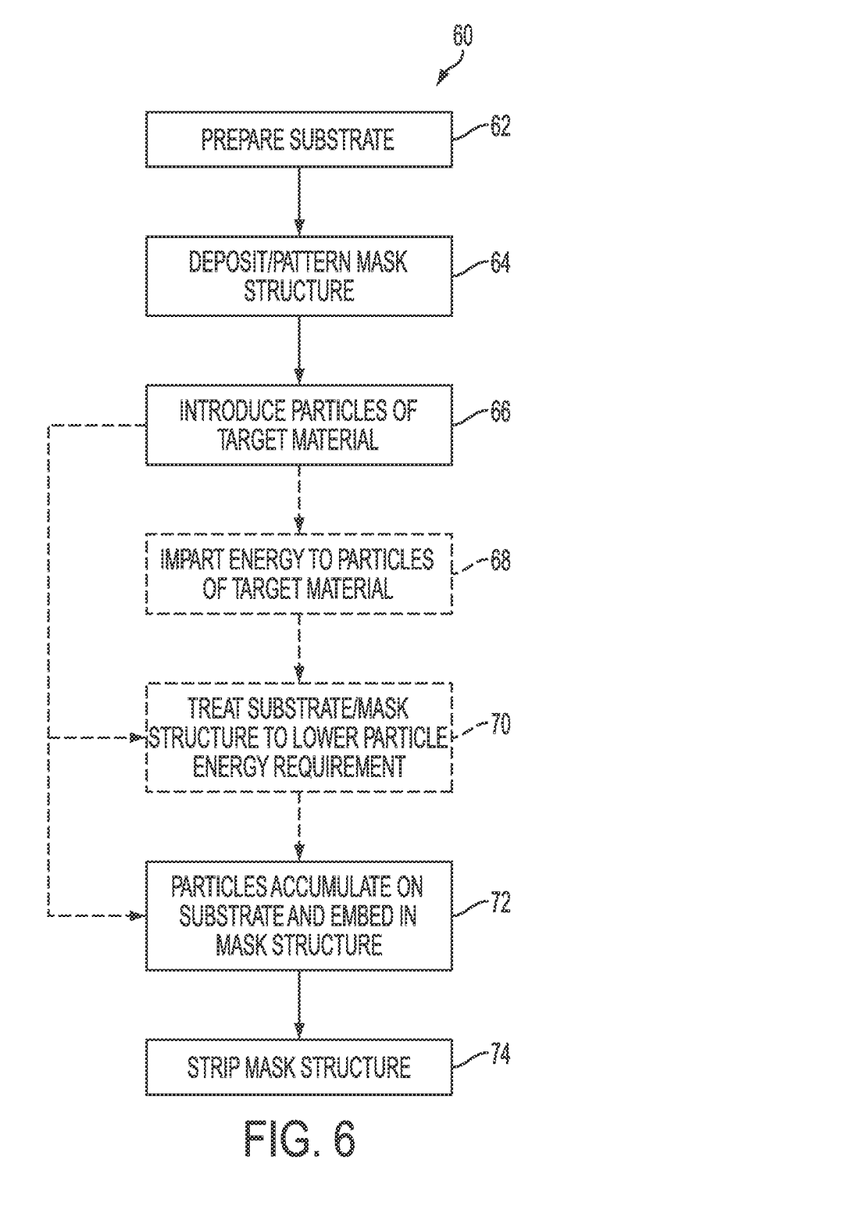
FIG. 6 is a process flow diagram illustrating various steps according to the present disclosure, and in which steps in dashed lines indicate optional steps.

The complete process 60 for the formation of a patterned wafer according to the present disclosure is illustrated in FIG. 6. According to process 60, following any necessary cleaning and preparation of the substrate at step 62, a print-patterned mask is deposition at step 64. At this point, particles of target material which shall form the patterned layer on the substrate are introduced into the vicinity of the substrate at step 66. These particles may be introduced with the desired energy to enable to be embedded into the material forming the print-patterned mask, or at optional step 68 they may be energized as needed. Furthermore, at optional step 70 the substrate may be treated (e.g., heated) to lower the required energy required of the particles. At step 72 the particles are caused to accumulate on the substrate and to be embedded within the print-patterned mask. Finally, at step 74, the print-patterned mask is stripped, taking with it target material particles embedded therein, leaving the accumulated target material as a patterned layer on the substrate.

The physics of modern electrical devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. For example, the forgoing description has focused on the formation of a patterned layer directly on the surface of a substrate. However, the process according to the present disclosure may be performed over any layer or layers formed over the substrate. Furthermore, one or more layer of material may be deposited over a layer patterned according to the present disclosure. Indeed, those subsequent layers may themselves be patterned by the process of the present disclosure. Therefore, the foregoing detailed description provides those of ordinary skill in the art with a convenient guide for implementation of the disclosure, by way of examples, and contemplates that various changes in the functions and arrangements of the described embodiments may be made without departing from the spirit and scope of the disclosure defined by the claims thereto.

What is claimed is:

1. A method for producing a patterned layer of target material over a substrate comprising the steps of:
    forming a print-patterned mask structure over said substrate such that a first surface of said mask structure is oriented toward said substrate and a second surface of said mask structure is oriented away from said substrate;
    heating said print-patterned mask structure in the range of 60° C.-70° C., such that said print-patterned mask structure is softened but not melted; after the heating,
    directing particles of said target material toward said substrate and said mask structure with sufficient energy such that:
        said particles enter said mask structure at said second surface;
        said target material substantially does not accumulate on said second surface;
        said target material accumulates as a layer of target material over said substrate other than over said mask structure;
        said heating facilitating entry of said particles of target material into said print-patterned mask structure; and
    removing said mask structure together with target material particles therein such that said layer of target material over said substrate other than over said mask structure remains as a patterned layer.

2. The method of claim 1, further comprising the step of removing said print-patterned mask structure, without undercutting, together with target material therein, leaving said generally uniform layer of target material as a patterned layer over said substrate.

3. The method of claim 2, wherein the step of removing said print-patterned mask structure together with target material particles therein comprises applying a solvent to said second surface of said print-patterned mask structure which dissolves said print-patterned mask structure but does not affect said layer of target material accumulated over said substrate.

4. The method of claim 2, wherein the step of removing said print-patterned mask structure together with target material particles therein comprises applying an etchant to said second surface of said print-patterned mask structure which etches said print-patterned mask structure but does not affect said layer of target material accumulated over said substrate.

5. The method of claim 1, wherein said particles are provided with sufficient kinetic energy such that said particles are caused to enter said mask structure.

6. The method of claim 5 further comprising the steps of:
    introducing said particles of target material into the vicinity of said substrate and said mask structure; and
    imparting kinetic energy to said introduced particles such that said imparted kinetic energy causes said particles to enter said mask structure.

7. The method of claim 1, wherein said particles are provided with sufficient thermal energy such that said particles are caused to enter said mask structure.

8. The method of claim 7 further comprising the steps of:
    introducing said particles of target material into the vicinity of said substrate and said mask structure; and
    imparting thermal energy to said introduced particles such that said imparted thermal energy causes said particles to enter said mask structure.

9. The method of claim 1, wherein said particles are provided with sufficient kinetic and thermal energy such that said particles are caused to enter said mask structure.

10. The method of claim 9 further comprising the steps of:
    introducing said particles of target material into the vicinity of said substrate and said mask structure; and
    imparting kinetic and thermal energy to said introduced particles such that said imparted kinetic and thermal energy causes said particles to enter said mask structure.

11. The method of claim 1, wherein said print-patterned mask structure is selectively heated as compared to regions of the substrate not covered by said print-patterned mask structure.

12. The method of claim 1, wherein said particles are directed toward said substrate and said mask structure by an arc spray method, said particles comprising copper and such that said copper particles are incident on said second surface of said mask structure at a temperature of at least 1085° C.

13. A method for producing a patterned layer of target material over a substrate comprising the steps of:
    forming a print-patterned mask structure over said substrate such that a first surface of said mask structure is oriented toward said substrate and a second surface of said mask structure is oriented away from said substrate;
    heating said print-patterned mask structure to a temperature in the range of 60° C.-70° C. such that said print-patterned mask structure is softened but not melted; after the heating,
    directing particles of said target material toward said substrate and said mask structure, said particles provided with sufficient kinetic and thermal energy, and said mask structure sufficiently permeable, that said particles of said target material incident on said mask structure enter said second surface of said mask structure and do not substantially accumulate on said second surface of said mask structure, and said target material particles otherwise accumulate as a layer of target material over said substrate other than over said mask structure; and
    removing said print-patterned mask structure together with target material particles therein by dissolving said print-patterned mask structure, without undercutting, such that said layer of target material which has accumulated over said substrate other than over said mask structure is not otherwise affected.

14. The method of claim 13, wherein said particles are directed toward said substrate and said mask structure by an arc spray method, said particles comprising copper and such that said copper particles are incident on said second surface of said mask structure at a temperature of at least 1085° C.

15. A method for producing a patterned layer of target material over a substrate comprising the steps of:
    forming a print-patterned mask structure over said substrate such that a first surface of said mask structure is oriented toward said substrate and a second surface of said mask structure is oriented away from said substrate;
    heating said print-patterned mask structure to a temperature in the range of 60° C.-70° C. such that said print-patterned mask structure is softened but not melted; after the heating,
    directing particles of said target material toward said substrate and said mask structure, said particles provided with sufficient kinetic and thermal energy, and said mask structure sufficiently permeable, such that said particles of said target material incident on said mask structure enter said second surface of said mask structure and do not substantially accumulate on said second surface of said mask structure, and said target material particles otherwise accumulate as a layer of target material over said substrate other than over said mask structure, thereby forming a plurality of discontinuous regions of target material over said substrate, said discontinuous regions of target material separated by said mask structure; and removing said print-patterned mask structure together with target material particles therein by dissolving said print-patterned mask structure, without undercutting, such that said layer of target material which has accumulated over said substrate other than over said mask structure is not otherwise affected.

16. The method of claim 15, wherein said particles are directed toward said substrate and said mask structure by an arc spray method, said particles comprising copper and such that said copper particles are incident on said second surface of said mask structure at a temperature of at least 1085° C.

* * * * *